United States Patent
Sun et al.

[11] Patent Number: 6,074,546
[45] Date of Patent: Jun. 13, 2000

[54] METHOD FOR PHOTOELECTROCHEMICAL POLISHING OF SILICON WAFERS

[75] Inventors: Lizhong Sun, Newark; James Shen, Bear, both of Del.; Lee Melbourne Cook, Steelville, Pa.

[73] Assignee: Rodel Holdings, Inc., Wilmington, Del.

[21] Appl. No.: 08/915,775

[22] Filed: Aug. 21, 1997

[51] Int. Cl.[7] .................. B23H 3/00; B23H 5/00; C25F 3/00; C25F 7/00

[52] U.S. Cl. .............. 205/655; 205/674; 205/675; 205/684; 216/94

[58] Field of Search .................. 205/655–656, 205/674, 675, 676, 684

[56] References Cited

U.S. PATENT DOCUMENTS

| | | | |
|---|---|---|---|
| 4,369,099 | 1/1983 | Kohl et al. | 205/646 |
| 4,415,414 | 11/1983 | Burton et al. | 205/655 |
| 4,482,443 | 11/1984 | Bacon et al. | 204/129.3 |
| 4,613,417 | 9/1986 | Laskowski et al. | 257/79 |
| 5,358,600 | 10/1994 | Canham et al. | 156/644 |
| 5,417,840 | 5/1995 | Block et al. | 205/246 |
| 5,431,766 | 7/1995 | Propst et al. | 156/345 |
| 5,690,807 | 11/1997 | Clark, Jr. et al. | 205/655 |

FOREIGN PATENT DOCUMENTS 3608604   9/1987   Germany.

OTHER PUBLICATIONS

Lewis, Richard J. Sr. (Hawley's Condensed Chemical Dictionary, John Wiley & Sons, New York, p. 885, (No month available) 1997.

Derwent English Abstract of DE 3608604 A, Sep. 1987.

C. Serre et al., "Characterization of the Electropolishing Layer During Anodic Etching of p–Type Silicon in Aqueous HF Solutions," Journal Electrochemical Soc., vol. 141, No. 8, 1994, pp. 2049–2053 No month available.

*Primary Examiner*—Kathryn Gorgos
*Assistant Examiner*—Wesley A. Nicolas
*Attorney, Agent, or Firm*—Kenneth A. Benson; Hilmar Fricke; Konrad Kaeding

[57] ABSTRACT

A method is provided for photochemical polishing of a silicon wafer using electromagnetic waves within the spectrum of 150 to 2000 nanometers wavelength. A photochemical polishing apparatus is also disclosed in which the electromagnetic waves are provided by a waveguide in close proximity to the surface of a silicon wafer electrode.

4 Claims, 1 Drawing Sheet

METHOD FOR PHOTOELECTROCHEMICAL POLISHING OF SILICON WAFERS

BACKGROUND OF THE INVENTION

1. Field of the Invention

This invention relates to the polishing of silicon wafers in preparation for their use in the production of integrated circuit chips.

2. Discussion of Related Art

Silicon wafers for the semiconductor industry must possess a high degree of surface perfection before they can be useful in the device fabrication process. These surfaces are universally produced by polishing the wafer with a polishing slurry. Polishing slurries generally consist of a composition which contains a concentration of submicron particles. The part, or substrate, is bathed or rinsed in the slurry in conjunction with an elastomeric pad which is pressed against the substrate and rotated such that the slurry particles are pressed against the substrate under load. The lateral motion of the pad causes the slurry particles to move across the substrate surface, resulting in wear, or volumetric removal of the substrate surface. Ideally, this process results in the selective erosion of projecting surface features so that when the process is completed a perfect plane surface is produced down to the finest level of detail.

The silicon polishing process as practiced in industry consists of two or more steps. In the first, or coarse polish step, gross defects remaining from wafer sawing and shaping operations are removed. The wafer surface appears smooth and specular but still contains numerous minute defects. These defects are removed by subsequent final polish steps which remove little material from the surface but act to polish away the surface defects. The present invention relates to these polishing processes.

Photoelectrochemical etching of semiconductor materials has been routinely carried out to provide holes and trenches in the semiconductor material. For example, U.S. Pat. No. 4,482,443, describes photoelectrochemical etching of N-type silicon using an alcohol based solution of hydrofluoric acid as the electrolyte.

It is known that silicon may be removed from the surface of a silicon wafer by photoelectrochemical action. This process has been used for many years to construct holes and trenches on silicon wafers and to make a porous silicon surface structure. If one could use the removal of silicon by photochemical action to provide a planarized surface, this would allow one to forego a standard polishing process with slurry particles and polishing pads and, therefore, provide a cleaner surface for subsequent processing of the wafer.

SUMMARY OF THE INVENTION

A method for photoelectrochemical polishing of a silicon wafer comprising: placing a silicon wafer in an electrolytic cell as an electrode and, with an electrolyte comprising a conductive ion as a nucleophilic or an electrophilic species, applying a potential to the electrode while irradiating the surface of the electrode with electromagnetic waves within the spectrum of 150 to 2000 nanometers wavelength.

Another aspect of this invention is an apparatus for the photoelectrochemical polishing of a silicon wafer comprising (a) said silicon wafer in an electrolytic cell as an electrode, (b) a waveguide which provides evanescent radiation of predetermined wavelength(s) in close proximity to the surface of said silicon wafer electrode, and (c) an electrolyte, in the space between said silicon wafer surface and said waveguide, having an absorption coefficient for said predetermined wavelength(s) such that said evanescent radiation is reduced to at most about 10% of its initial intensity over a path length of about 2 microns. A further aspect of this invention is a method for photoelectrochemical polishing of a silicon wafer comprising: placing the silicon wafer in an electrolytic cell as an electrode, the electrolytic cell having a waveguide which provides evanescent radiation of predetermined wavelength(s) in close proximity to the surface of the silicon wafer electrode, the electrolytic cell also having an electrolyte, in the space between the silicon wafer surface and the waveguide, having an absorption coefficient for predetermined wavelength(s) such that evanescent radiation is reduced to at most about 10% of its initial intensity over a path length of about 2 microns.

DETAILED DESCRIPTION OF THE INVENTION

Figure 1:
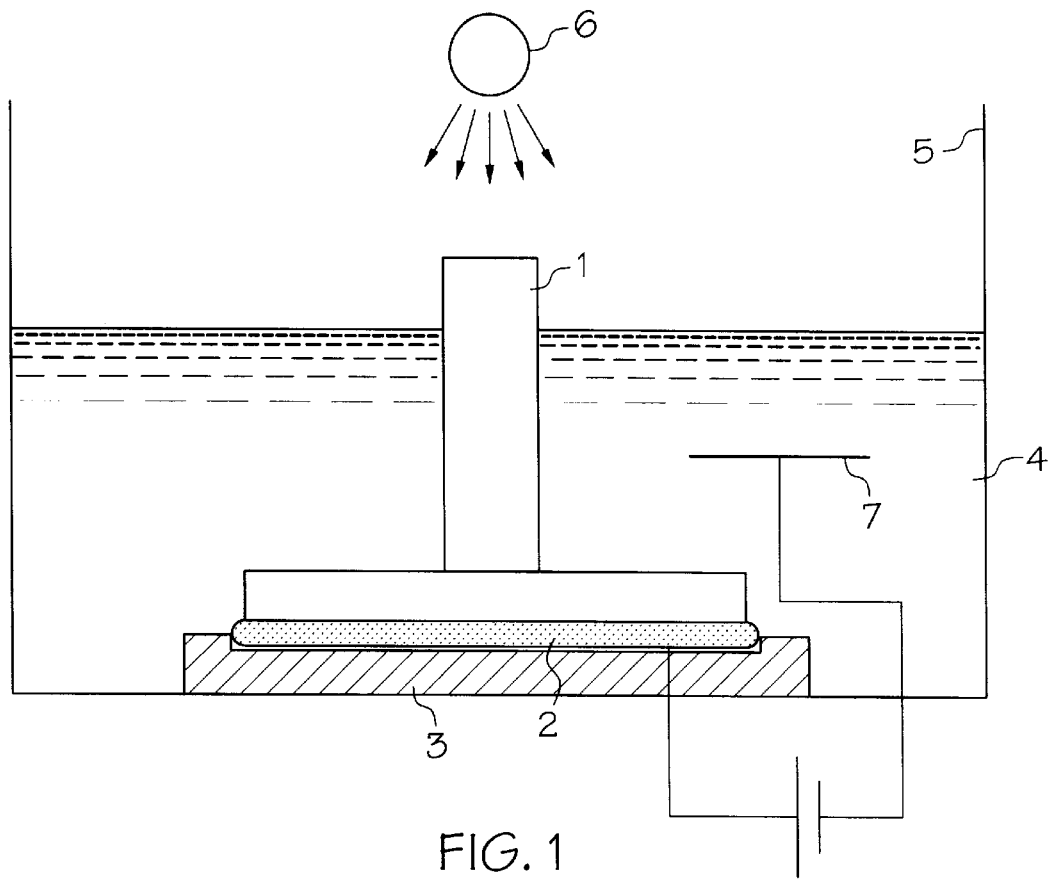
FIG. 1 shows a cross section of an electrolytic cell containing a wave guide.

A photoelectrochemical cell can be used for the polishing of a silicon wafer in the following way. A doped wafer of silicon of either the n-type or the p-type is used as an electrode along with a counter electrode which might be platinum or any other metal used for this purpose. The electrode is placed in a container which contains an electrolyte and electromagnetic radiation in the ultraviolet, visible or near infra red spectrums is provided to the surface of the electrode. The electrolyte contains a conductive ion as a nucleophilic or electrophilic species. A potential of a given voltage is applied to the electrodes while the surface of the silicon electrode is irradiated.

The condition of the surface of the silicon wafer electrode is determined by Nomarski microscopy and/or Zygo surface profilometry. The Nomarski pictures show the general condition of the surface including the number and size of pits in the surface structure. The Zygo profilometer can give a quantitative measure of surface roughness as the root-mean-square of surface variations.

Average removal rate from the surface of the silicon wafer during a test is determined from the weight of the silicon wafer electrode before and after photoelectrochemical polishing.

EXAMPLES

Stock polished n-type Si was used as an electrode in an electrolytic cell by making ohmic contact with a 2 cm by 2 cm sheet of n-type Si. An Ag/AgCl reference electrode and a Pt mesh counter electrode were used in the cell. The electrolyte was an aqueous solution of $NH_4F$ at about 1 Molar concentration. Prior to PEC polishing tests the n-type Si electrodes were cleaned for one minute in a 25% aqueous solution of hydrogen fluoride. The open circuit dark potential and photopotential of the n-type Si electrode in the solution are $\phi_d = -0.635$ V and $\phi_{photo} = -0.590$ V, respectively. The light source used was a 250 W halogen lamp situated at various distances from the electrolytic cell. The silicon removal rate from the surface of the n-type Si electrode was determined from the weight of the electrode before and after exposure to PEC polishing. The n-type Si electrode surface was examined by both Nomarski microscope and Zygo before and after exposure to given photoelectrochemical conditions to compare surface roughness. There is an improvement in surface roughness under conditions which give a reasonable removal rate of about 0.1 to about 0.3 µm/min.

For example, the following removal rates and RMS surface roughness measurements were obtained on silicon wafer electrodes which prior to PEC polishing were cleaned by using a standard cleaning solution, SC1, for 2 minutes.

TABLE 1

| Electrode | Applied Potential (Volts) | Removal rate (µm/min) | TMS (A)(80 µm filter) |
|---|---|---|---|
| before | N/A | N/A | 8.21 |
| #1 | 0.90 | 0.063 | 8.13 |
| #2 | 1.50 | 0.085 | 7.35 |
| #3 | 2.50 | 0.12 | 6.90 |

It is obvious that a smoother surface can be obtained by means of photoelectropolishing. This was also shown at higher removal rates by examining the surface before and after photoelectropolishing by taking photographs of the electrode surface using a Nomarski microscope. Conditions for these experiments and the results are given in Table 2.

TABLE 2

| Electrode | $NH_4F$ Conc. Molar | Applied Potential Volts | Time min. | Overall Removal Rate µm/min | Surface |
|---|---|---|---|---|---|
| #25 | 8 | 0.5 | 10 | 0.28 | Unimproved |
| #27 | 8 | 0.5 | 5 | | |
| | 1 | 0.2 | 5 | 0.24 | Improved |
| #30 | 4* | 0.8 | 10 | 0.27 | Improved |

*Electrolyte also contained 0.1% piperonal.

These results show that the concentration of $NH_4F$ in the electrolyte is preferably from about 0.5M (molar) to about 8M. At 8M all samples showed pitting on the surface of the silicon wafer. More preferably the electrolyte concentration is about 1M to about 5M. And most preferably it is about 4M.

The results also show that one can also obtain an improved surface when, for example, the silicon wafer electrode is exposed to 8M electrolyte for a time period and then is exposed to 1M electrolyte for an additional time period. For example, when a wafer was exposed to 8M electrolyte at a potential of 0.5 volts for 5 minutes and then exposed to IM electrolyte at a potential of 0.2 volts for 5 minutes, the overall removal rate was 0.24 microns/minute and the electrode surface was less rough as shown by Nomarski microscope photographs.

Another way to obtain an improved surface is to add a small amount of surfactant to the electrolyte. For example, when 0.1% piperonal was added to a 4M electrolyte, the resulting surface was much improved as shown by Nomarski microscope photographs. At a potential of 0.8 volts for a ten minute exposure the removal rate was 0.27 microns/minute. It is felt that surfactant of any kind (anionic, ionic, and non-ionic) might be used effectively at concentrations from about 0.1% to about 5% by weight.

In order to be particularly effective in smoothing the surface of the silicon wafer electrode surface, the illumination radiation may be transmitted in close proximity to the surface of the silicon wafer electrode. This can be provided by using a waveguide for the incoming light which is transparent to the wavelength(s) of interest and which has a refractive index greater than that of the electrolyte surrounding it. Simple illumination of light in an ordinary photoelectrochemical process does not yield spatial selectivity because the surfaces of peaks and valleys on the wafer surface will dissolve at the same rate since reactant concentrations and light intensity are essentially constant at all points. In order to efficiently smooth the surface, improvements to the basic techniques of photoelectrochemical processing have been discovered.

If the illumination is provided by passing the light source through a waveguide structure, some of the light leaks out of the waveguide into the proximate vicinity of the surface. These are evanescent waves. They are significantly increased when the waveguide actually contacts the surface of the silicon wafer. Thus the peaks which contact the waveguide will receive more radiation than the noncontacted portions of the wafer. If a particular wavelength of radiation is used, the spatial selectivity of the evanescent waves are increased if the electrolyte absorbs radiation at that wavelength. The percent of radiation transmitted can be determined by Equation 1.

$$\% \text{ radiation transmitted } v = e^{-\alpha CL}$$

where $\alpha$ is the absorption coefficient, C is the molar concentration of absorbent in the electrolyte, and L is the path length.

If the electrolyte is highly absorptive, the evanescent radiation can only react with substrate asperities where L is low and cannot reach recesses where L is high. By judicious choice of absorption coefficient at a given wavelength and concentration of absorbent, one can significantly improve the smoothing effect versus an ordinary PEC process. One can tailor the absorption of the electrolyte solution by picking a solvent which highly absorbs a given wavelength of radiation or by the addition of an soluble dye which absorbs a given wavelength of radiation. A further improvement to this technique will be to vibrate, oscillate or rotate the waveguide in a random fashion to avoid regular patterns of removal.

Construction of the waveguide can be of any material such as a plastic which is used commonly for optical purposes. It is most desirable to use a plastic which is transparent to the wavelength of interest and has a refractive index, $n_1$, higher than that of the electrolyte, $n_2$.

A possible configuration for a waveguide and electrolytic cell of this invention is shown in FIG. 1. A rotating disc waveguide 1 is shown in close contact with a silicon wafer 2 which is supported by a carrier 3. These elements of the apparatus are immersed in the electrolyte 4 in a cell container 5. A potential is applied between the silicon wafer and a counter electrode 7 in the electrolyte 4. A light source 6 provides light energy for this photoelectric process.

Figure 2:
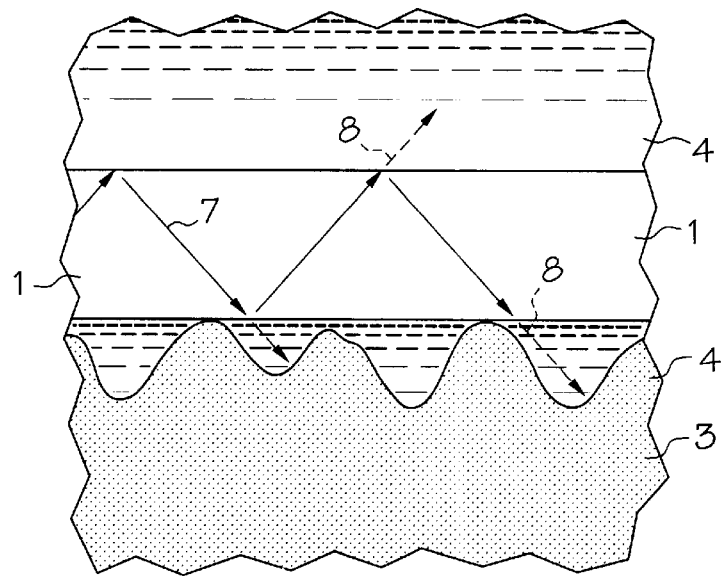
FIG. 2 shows schematically how light affects the peaks on the surface of a silicon wafer.

FIG. 2 shows schematically how the light affects just the peaks on the surface of the silicon wafer, thereby, smoothing the peaks to provide a polishing action. In this schematic drawing, the waveguide is shown to have a smooth surface. It would in reality have a roughness probably about equal to that on the surface of the silicon wafer. There would, however, be contact of the waveguide 1 and the wafer peaks 9 at many points on the surface of the wafer 3 so that evanescent light waves 8 would reach the peaks 9 and they would be worn away by the photoelectrochemical action of the light waves 8 and the electrolyte 4. The reflected light beams 7 within the waveguide provide the evanescent light waves 8 which exit the waveguide 1 to effect the photoelectrochemical action.

There are no doubt many other apparatus configurations which might fall within the scope of this invention. The invention is only defined by the scope of the claims below:

What is claimed is:

1. A method for photoelectrochemical polishing of a silicon wafer comprising: placing said silicon wafer in a photoelectrolytic cell as an electrode and, with an electrolyte comprising a conductive ion as a nucleophilic or an electrophilic species, applying a potential to said silicon wafer electrode while irradiating the surface of said silicon wafer electrode with electromagnetic waves within the spectrum of 150 to 2000 nanometers wavelength;

wherein said photoelectrolytic cell comprises: (a) a wave guide which provides evanescent radiation of predetermined wavelength(s) in close proximity to the surface of said silicon wafer electrode and (b) an electrolyte, in the space between said silicon wafer surface and said wave guide, having an absorption coefficient for said predetermined wavelength(s) such that said evanescent radiation is reduced to at most 10% of its initial intensity over a path length of 2 microns.

2. A method according to claim 1 wherein said electrolyte comprises ammonium fluoride at about 0.5 molar to 8 molar concentration in water.

3. A method according to claim 2 wherein said electrolyte further comprises a surfactant at about 0.1% to about 5% by weight.

4. A method according to claim 3 wherein said surfactant is piperonal.

* * * * *